United States Patent
Fujiwara

(10) Patent No.: US 6,464,781 B2
(45) Date of Patent: *Oct. 15, 2002

(54) METHOD OF SUPPRESSING CONVECTION IN A FLUID IN A CYLINDRICAL VESSEL

(75) Inventor: Shinsuke Fujiwara, Osaka (JP)

(73) Assignee: Sumitomo Electric Industries, Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/893,223

(22) Filed: Jul. 15, 1997

(65) Prior Publication Data

US 2001/0054375 A1 Dec. 27, 2001

(30) Foreign Application Priority Data

Jul. 15, 1996 (JP) .............................. 8-184827
May 30, 1997 (JP) .............................. 8-141749

(51) Int. Cl.[7] .............................................. C30B 23/00
(52) U.S. Cl. ...................................................... 117/109
(58) Field of Search ............................. 117/30, 82, 84, 117/109; 366/105

(56) References Cited

U.S. PATENT DOCUMENTS

| | | | | |
|---|---|---|---|---|
| 4,649,859 A | * | 3/1987 | Wanlass | 118/715 |
| 5,126,114 A | * | 6/1992 | Kamio et al. | 422/249 |
| 5,284,519 A | * | 2/1994 | Cadgil | 118/719 |
| 5,363,796 A | * | 11/1994 | Kobayashi et al. | 117/30 |

FOREIGN PATENT DOCUMENTS

| | | | |
|---|---|---|---|
| EP | 0244987 | * | 4/1987 |
| FR | 2 537 731 | | 3/1987 |
| JP | 63-185885 | * | 8/1988 ........... C30B/11/08 |
| JP | 4-202082 | * | 7/1992 |
| JP | 5-4894 | * | 1/1993 ........... C30B/25/14 |
| JP | 05004894 | * | 1/1993 |

OTHER PUBLICATIONS

McGraw–Hill Encyclopedia of Physics, Sybil P. Hill, editor, McGraw–Hill, New York, NY, USA, pp. 176–177, 1983.*
Bottcher et al., Zinc Selenide Single Crystal Growth by Chmical Transport Reactions, Journal of Crystal Growth, vol. 146, pp. 53–58, 1995.*
Perry et al. (eds.), Chemical Engineers' Handbook, Fifth Ed., McGraw–Hill, New York, USA, pp. 10–9 to 10–18, 1973.*
G.H. Westphal et al, A Flow Channel Reactor for GaAS Vapor Phase Epitaxy, 2300 Journal of Crystal Growth vol. 56 (1982) Jan., No. 2, pp. 324–331.
K. Bottcher et al, Zinc Selenide Single Crystal Growth by Chemical Transport Reactions, Journal of Crystal Growth 146 (1995) Jan. 01, No.S 1/4, pp. 53–58.
Hiroyuki, Patent Abstracts of Japan, 04202082, Jul. 22, 1992, vol. 16, No. 533 (C–1002).
Yoshitaka et al, Patent Abstracts of Japan, 05004894, Jan. 14, 1993, vol. 17, No. 266 (C–1062).

* cited by examiner

Primary Examiner—Benjamin L. Utech
Assistant Examiner—Matthew Anderson
(74) Attorney, Agent, or Firm—McDermott, Will & Emery

(57) ABSTRACT

An object of the present invention is to provide a method of suppressing convection of a fluid in a cylindrical vessel by means of realizing an environment under micro gravity which can be maintained for such a long time that growth of a large-sized crystal be economically effected. The feature of the present invention consists in a method of suppressing occurrence of natural convection of a fluid in a cylindrical vessel, when a density gradient due to difference in temperature, concentration or partial pressure is added to the gas or liquid filled in the cylindrical vessel along the central axis of the vessel, characterized by maintaining horizontal the vessel and rotating it around the central axis.

2 Claims, 3 Drawing Sheets

METHOD OF SUPPRESSING CONVECTION IN A FLUID IN A CYLINDRICAL VESSEL

BACKGROUND OF THE INVENTION

1. Field of the Invention

This invention relates to a method of suppressing occurrence of a natural convection in a fluid in a cylindrical vessel and a method of growing a compound semiconductor crystal of Group II-VI elements of Periodic Table such as ZnSe utilizing the method of suppressing occurrence of a natural convection.

2. Description of the Prior Art

When there is a density gradient in a fluid in a cylindrical vessel, it is desirable to arrange the fluid in micro gravity so as to suppress natural convection occurring in the fluid. The environment under micro gravity can be realized by subjecting the fluid itself to free fall or arranging it outside the gravity zone utilizing satellite orbit.

A method comprising growing a compound semiconductor crystal of Group II-VI elements of Periodic Table such as ZnSe, ZnS, CdS, etc. by a chemical vapor transport method using iodine as a transport agent has widely been used, but in general, it is said to be difficult to obtain a single crystal under such a condition that natural convection in an ampoule is strengthened. For example, it has been reported in "J. Crystal Growth 146 (1995) 53" that in the case of growing ZnSe crystal, its single crystal can be obtained only under such a condition that a gas pressure in an ampoule is small and natural convection is thus hard to occur. Furthermore, it has been proposed in Japanese Patent Laid-Open Publication No. 4894/1993 to provide an internal structure for preventing occurrence of natural convection and obtaining a single crystal between a raw material charged zone and crystal growth zone in an ampoule.

The above described method of suppressing occurrence of natural convection in micro gravity, however, needs an expensive installation whose application is largely limited. For example, the micro gravity by a falling tower is lasting only in a very short time, e.g. about 10 seconds. Consequently, this installation is limited in application thereof and cannot be applied to a method needing several hours to several ten days, such as a method for the growth of a crystal.

In a method for the growth of a compound semiconductor crystal of Group II-VI elements of Periodic Table by a chemical vapor transport method using iodine as a transport agent, for example, an internal pressure in an ampoule is generally high, for example, several atm., and natural convection tends to occur. Further, it is noted that when the natural convection is strong, a grown crystal tends to be polycrystalline and growth of a single crystal is difficult. When an inner diameter of a growth ampoule is increased, in addition, the convection is strong and accordingly, even if the crystal growth of a compound semiconductor crystal of Group II-VI elements of Periodic Table is carried out, it is difficult to obtain a large-sized single crystal.

In a method comprising providing an internal structure for preventing occurrence of gaseous convection between a raw material charged zone and crystal growth zone in an ampoule, as disclosed in Japanese Patent Laid-Open Publication No. 4894/1993, it is required to enlarge the crystal growth zone to grow a large-sized crystal and consequently, a new gaseous convection occurs in the crystal growth zone so that sufficient convection suppressing effect cannot be maintained.

SUMMARY OF THE INVENTION

It is an object of the present invention to provide a method of suppressing convection of a fluid in a cylindrical vessel by means of realizing an environment under micro gravity which can be maintained for such a long time that growth of a large-sized crystal be economically effected, whereby the above described problems can be solved.

It is another object of the present invention to provide a method of growing a compound semiconductor crystal of Group II-VI elements of Periodic Table by utilizing the method of suppressing convection of a fluid in a vessel.

These objects can be attained by a method of suppressing convection of a fluid in a cylindrical vessel, when a density gradient due to difference in temperature, concentration or partial pressure is added to the gas or liquid filled in the cylindrical vessel along the central axis of the vessel, characterized by maintaining horizontal the vessel and rotating it around the central axis.

BRIEF DESCRIPTION OF THE DRAWINGS

The accompanying drawings illustrate the principle and merits of the present invention in detail.

DETAILED DESCRIPTION OF THE INVENTION

Figure 1:
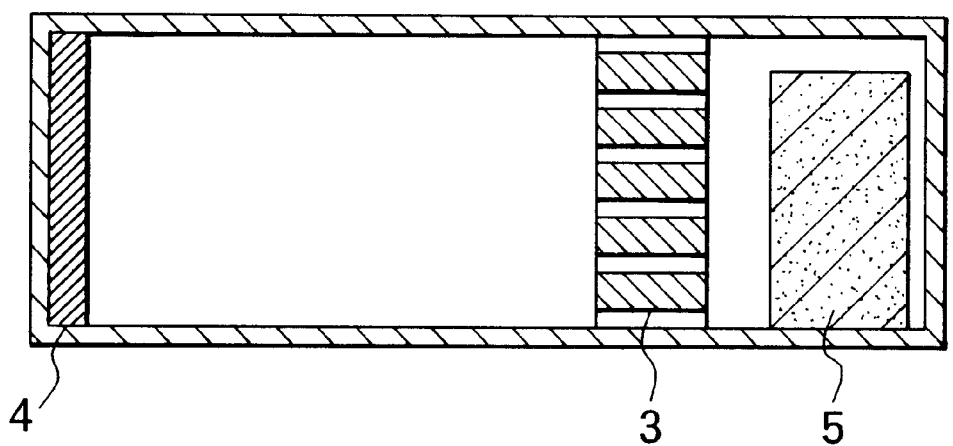
FIG. 1 is a cross-sectional view of a cylindrical vessel used in the present invention.

The inventors have made various efforts to develop a method of suppressing convection of a fluid in a vessel by means of realizing an environment under micro gravity which can be maintained for such a long time that growth of a large-sized crystal be economically effected, and a method of growing a compound semiconductor crystal of Group II-VI elements of Periodic Table by utilizing the method of suppressing convection of a fluid in a vessel. Consequently, it is found that maintaining horizontal the cylindrical vessel and rotating it around the central axis thereof is effective for this purpose. The present invention is based on this finding.

That is, the present invention comprises constructions summarized below:

(1) A method of suppressing occurrence of natural convection of a fluid in a cylindrical vessel, when a density gradient due to difference in temperature, concentration or partial pressure is added to the gas or liquid filled in the cylindrical vessel along the central axis of the vessel, characterized by maintaining horizontal the vessel and rotating it around the central axis.

(2) The method of suppressing convection, as described in the above (1), wherein in the case of arranging a solid in the vessel, the solid is fixed to the vessel and rotated with the vessel.

(3) The method of suppressing convection, as described in the above (1), wherein in the case of arranging a solid in the vessel, the solid is maintained in one zone of the vessel, separated by a network partition plate, another zone being a convection suppressing zone.

(4) The method of suppressing convection, as described in any one of the above (1) to (3), wherein in the case of filling the vessel with a gas, the vessel is rotated with a rotational frequency f capable of satisfying the following relationship:

$$(1/\pi)(g/2L)^{1/2} > f > (gL\Delta\rho/\rho)/(1000\nu)$$

where L is a diameter of the vessel, g is the gravitational acceleration, ρ is a density of the gas, Δρ is a difference between a minimum density and maximum density of the gas due to a temperature distribution, concentration distribution or partial pressure distribution along the central axis of the vessel and ν is a kinematic viscosity coefficient.

(5) A method for the growth of a compound semiconductor crystal of Group II-VI elements of Periodic Table in a cylindrical vessel by a chemical vapor transport method using iodine as a transport agent, characterized by carrying out the growth of the crystal while maintaining the vessel horizontal, holding a solid raw material at one end of the vessel to secure a crystal growth zone and rotating the vessel around the central axis.

(6) The method for the growth of a compound semiconductor crystal of Group II-VI elements of Periodic Table, as described in the above (5), wherein the solid raw material is fixed to one end of the vessel and rotated with the vessel. (7) The method for the growth of a compound semiconductor crystal of Group II-VI elements of Periodic Table, as described in the above (5), wherein the solid raw material is maintained in a raw material charging zone at one end of the vessel, using a network partition plate, the crystal growth zone is secured toward another end, the vessel is rotated around the central axis and the growth of the crystal is carried out while suppressing occurrence of convection in the crystal growth zone.

(8) The method for the growth of a compound semiconductor crystal of Group II-VI elements of Periodic Table, as described in the above (7), wherein the thickness of the partition plate is larger than a diameter of a hole made in the partition plate.

(9) The method for the growth of a compound semiconductor crystal of Group II-VI elements of Periodic Table, as described in any one of the above (5) to (8), wherein the vessel is rotated with a rotational frequency f capable of satisfying the following relationship:

$$(1/\pi)(g/2L)^{1/2} > f > (gL\Delta\rho/\rho)/(1000\nu)$$

where L is a diameter of the vessel, g is the gravitational acceleration, ρ is a density of the gas, Δρ is a difference between a minimum density and maximum density of the gas due to a temperature distribution, concentration distribution or partial pressure distribution along the central axis of the vessel and μ is a kinematic viscosity coefficient.

Generally, a flow rate of natural convection of a fluid in a vessel is determined by balance of a force on the fluid, caused by the gravity correspondingly with a density gradient of the fluid, and a reaction force on the fluid flow, caused by the vessel wall through the viscosity of the fluid, in an equilibrium state. Until reaching the equilibrium state (when the flow rate is small and the reaction force by viscosity is small), the fluid has an acceleration determined by the gravity and inertia force of the fluid and the flow rate is accelerated. Therefore, in case the direction of the gravity is changed in a period faster than a time required for which the flow rate reaches the equilibrium state, the flow rate accelerated in its period is a maximum flow rate of the fluid. Accordingly, if the period when the direction of the gravity is changed is shortened, the flow rate of natural convection of the fluid can be decreased.

In a method of changing the direction of the gravity added to a fluid, the direction of the gravity added to the fluid can effectively be changed by rotating the fluid itself around an axis different from the direction of the gravity. In order to rotate the fluid, rotating of a vessel charged with the fluid is sufficient for this purpose. However, in order to synchronize rotating of the vessel and that of the fluid, it is required to rotate the vessel at a uniform velocity.

Herein, it is to be noted that since rotating of a fluid results in a centrifugal force, it is necessary to minimize an effect of this centrifugal force and maximize an effect of suppressing natural convection by rotating. Thus, the present invention has succeeded in suppressing convection by maintaining horizontal a cylindrical vessel and rotating it around the center of the vessel.

The suppressing action of natural convection will be illustrated in detail. It is considered that when a vessel is rotated in a sufficiently shorter period than such a period that a circulating flow of convection runs around in the rest cylindrical vessel, the convection in the vessel is suppressed. A flow velocity V of the convection can be represented by the following formula from a relationship of a driving force of convection due to a density gradient of a fluid and a reaction force caused by the vessel wall through the viscosity:

$$V = C_1(gL^2\Delta\rho/\rho)/\nu$$

$C_1$: constant
g: gravitational acceleration
L: diameter of cylindrical vessel
ρ: density of gas
Δρ: density difference due to temperature gradient, concentration gradient or partial pressure gradient along the central axis of vessel
ν: kinematic viscosity Since a length $L_2$ of the circulating flow is substantially proportional to the diameter L of the cylindrical vessel, a rotational frequency $f_c$ of the circulating flow can be represented by the following formula:

$$f_c = C_2(gL\Delta\rho/\rho)/\nu$$

$C_2$: constant

Accordingly, a rotational frequency $f_{CR}$ of the vessel required for suppressing convection in the vessel can be represented by the following formula and when revolving is carried out with a rotational frequency of larger than $f_{CR}$, the natural convection in the vessel can be suppressed:

$$f_{CR} \gg f_c = C_2(gL\Delta\rho/\rho)/\nu \qquad (1)$$

$$= (gL\Delta\rho/\rho)/C\nu$$

C: constant

The above described formula (1) is converted into dimensionless to give the following formula:

$$f_{CR}L^2/\rho = Gr/C \qquad (2)$$

wherein Gr represents a dimensionless number called Grashof number, defined by the following formula:

$$Gr = (gL^3\Delta\rho/\rho)/\nu^2$$

It is found as a result of accumulating experiments of crystal growth by a vapor transport method that the constant C in the above described formulas (1) and (2) is represented by a relationship of C=1000.

Generally, the convection of a fluid in a rest cylindrical vessel will be of similarity if four dimensionless numbers of Grashof number (Gr), Prandtl number (Pr), Schmidt number (Sc) and Aspect Ratio (Ar) are same. If the rotational frequency f is same as $(fL^2/\nu)$, when the vessel is rotated, in addition to the above described four dimensionless number, the fluid in the vessel becomes similar.

In this formula, $Pr=\nu/\kappa$ $Sc=\nu/D$

Ar=Length of Vessel/Diameter of Vessel

Formulas (1) and (2) are the formulas of two dimensionless numbers, Gr and $(fL^2/\nu)$ and it is presumed that if Pr, Sc and Ar are changed, the constant C in Formulas (1) and (2) is somewhat changed. However, when the fluid is limited to gases, Formulas (1) and (2) are considered to be adapted to all the gases, because the constant is hardly changed with the small change of Pr, Sc and Ar.

Since rotation of a vessel results in a centrifugal force, the effect of suppressing convection by the rotation of a vessel is deteriorated if the rotating velocity is too increased. A maximum value of an acceleration caused by the centrifugal force is $(L/2 \times \omega^2)$, wherein $\omega$ is an angular velocity of the rotation), so if this is smaller than the gravitational acceleration g on the earth, the effect of suppressing convection by rotation of the vessel can be expected. Therefore, it is important that the rotational frequency of a cylindrical vessel satisfies the following formula:

$$f=\omega/2\pi<(1/\pi)(g/2L)^{1/2}$$

In a method comprising growing a compound semiconductor crystal of Group II-VI elements of Periodic Table by a chemical vapor transport method using iodine as a transport agent, a gas (fluid) in an ampoule (cylindrical vessel) is a mixed gas composed of iodine, an iodide of Group II element of Periodic Table and a gas of Group VI element of Periodic Table, to which the above described convection suppressing method can be applied. In this method, however, there are a raw material polycrystal, seed crystal and grown crystal as solids in the ampoule in addition to the gas. Thus, it is necessary to fix these solids so as to rotate the gas in the ampoule simultaneously with the rotating velocity of the ampoule.

In this case, fixing of the seed crystal and grown crystal thereon can be carried out by fixing the seed crystal, but a special means for fixing the raw material polycrystal is required since the raw material polycrystal becomes gradually smaller during crystal growth.

In an apparatus shown in FIG. 1, a part for holding the raw material polycrystal 5 is divided by a partition plate 3 such as network structure, etc. and this partition plate 3 is fixed to the ampoule 7, whereby a crystal growth zone can fully be used as a free space and and the gas present therein can be rotated at the same velocity as the ampoule 7. On the other hand, in a raw material charged zone for holding the raw material polycrystal 5, the raw material polycrystal 5 is unevenly distributed and in some cases, the gas cannot always be rotated at the same velocity as the ampoule.

That is, the gas diffusing from the raw material charged zone to the crystal growth zone through the partition plate is not always rotated at the same velocity as the ampoule. The above described problem can be solved when the thickness of the partition plate is rendered at least larger than a diameter of holes made in the partition plate, the gas is given angular momentum while passing through the partition plate and thus is rotated at the same velocity as the ampoule, followed by diffusing through the partition plate.

Figure 2:
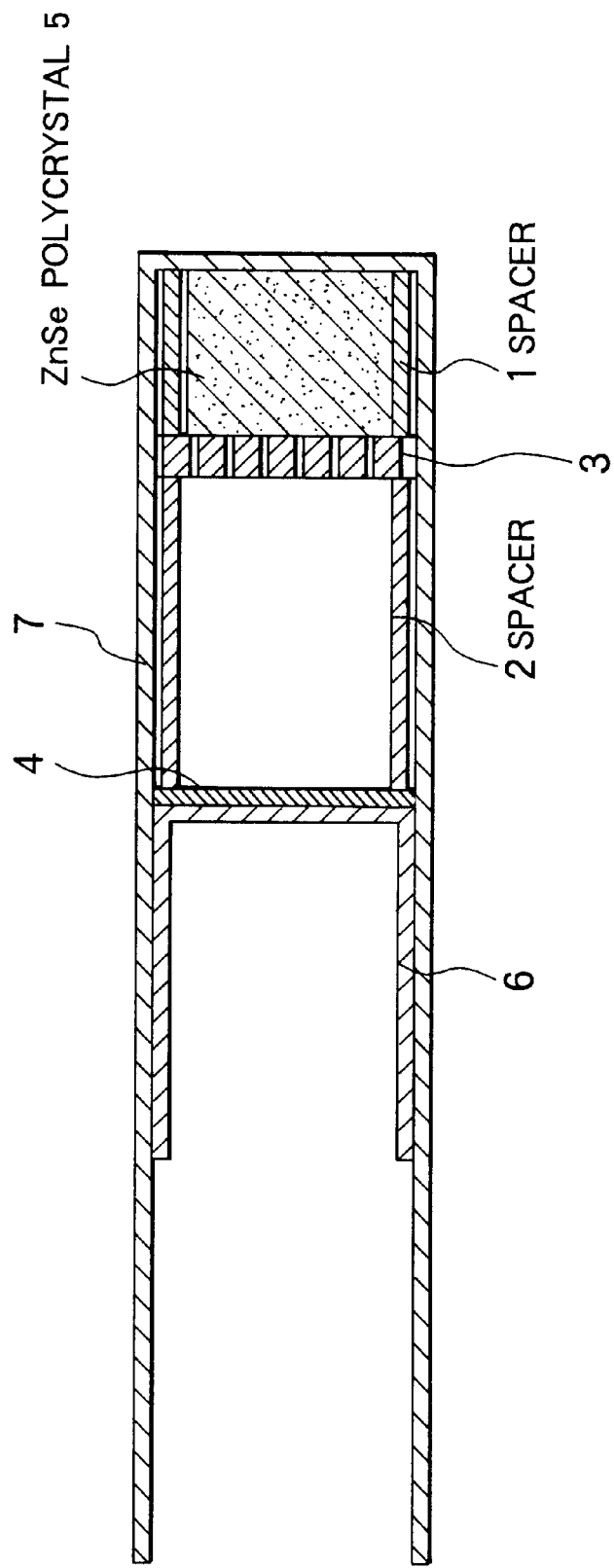
FIG. 2 is a cross-sectional view of a cylindrical vessel used in Example of the present invention.

In an apparatus shown in FIG. 2, a partition plate 3 is fixed to an ampoule 7 by a spacer 1 and spacer 2 to form a raw material charged zone in the spacer 1 and a seed crystal 4 is fixed by the spacer 2 and a sealing cover 6 to form a crystal growth zone in the spacer 2.

Figure 3:
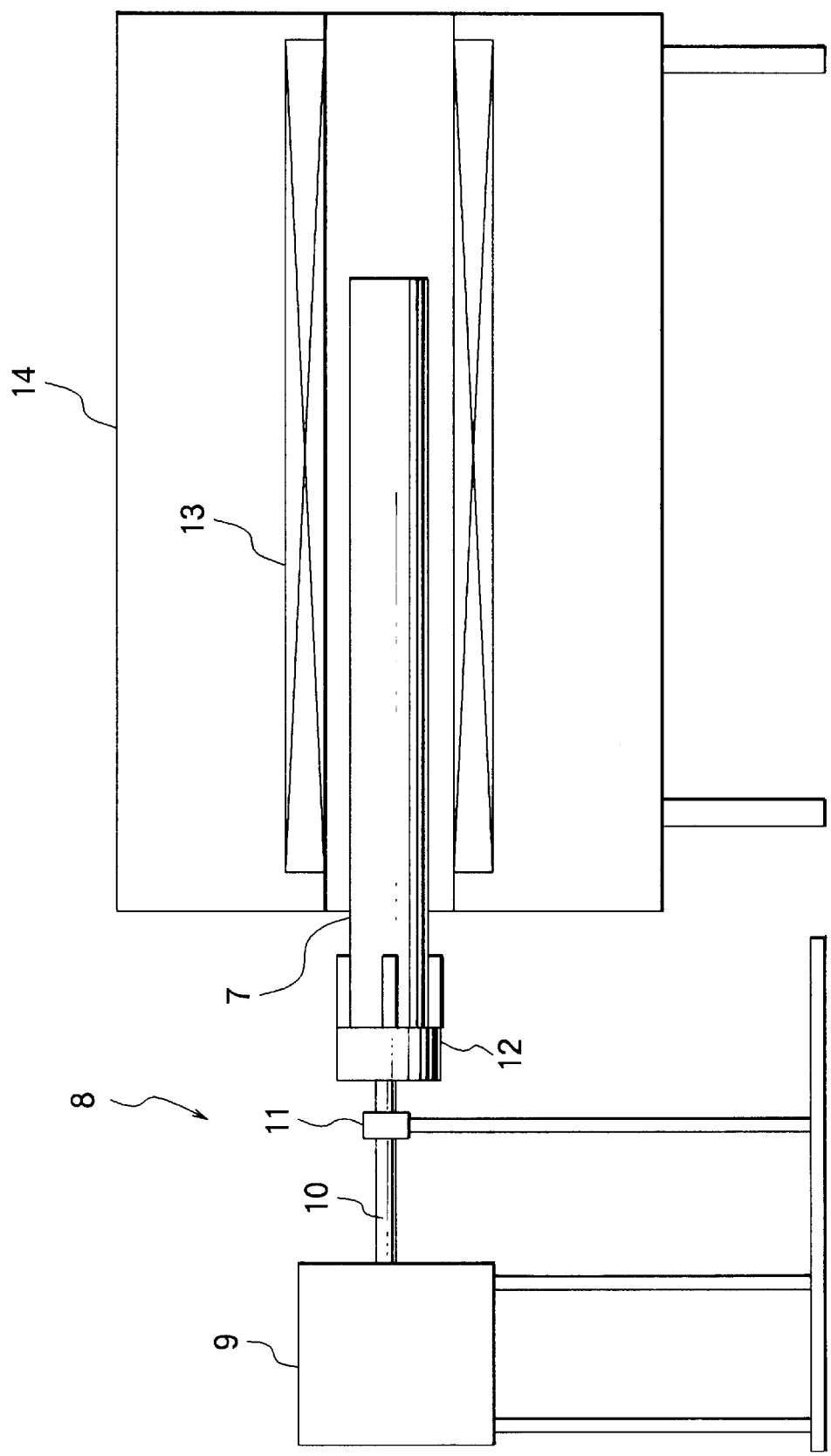
FIG. 3 is a schematic view of an apparatus for the growth of a crystal, provided with a horizontal rotation driving means of a cylindrical vessel and horizontal furnace, for the practice of the method of the present invention.

In a system shown in FIG. 3, the above described ampoule 7 is fixed to a horizontal shaft 10 in connection with a rotation driving means 9 through a bearing 11 and fixing chuck 12, maintained horizontal and inserted in a horizontal furnace 14 provided with a heater 13, whereby a predetermined temperature distribution is given to the rotating ampoule and a crystal is thus grown. 8 designates a rotation driving mechanism comprising a rotation driving means 9, horizontal shaft 10, bearing 11 and fixing chuck 12.

The present invention will now be illustrated in detail by the following example without limiting the same.

EXAMPLE

ZnSe single crystal was grown using an ampoule shown in FIG. 2, comprising a one side-sealed quartz tube with an inner diameter of 36 mm and a length of 400 mm as an outer tube, quartz tube with an inner diameter of 30 mm, outer diameter of 34 mm and a length of 20 mm as a spacer 1, quartz plate with a diameter of 35 mm and thickness of 5 mm, having thirty holes made therein each having a diameter of 3 mm as a partition plate and quartz tube with an inner diameter of 30 mm, outer diameter of 34 mm and a length of 40 mm as a spacer 2. A ZnSe polycrystal (thickness 20 mm, diameter 29 mm, synthesized by a CVD method) was arranged in the raw material zone formed by the spacer 1 and partition plate, and a seed crystal (ZnSe single crystal, thickness 1 mm, diameter 35 mm) was arranged between the spacer 2 and sealing cap. Iodine (1 mg per 1 $cm^{-3}$ of inner volume of ampoule) was further filled in this system and after evacuating the inside of the outer tube, a part of the sealing cap was welded to prepare an ampoule. The partition plate and spacer 2 were welded to the ampoule. The seed crystal was pressed by the spacer 2 and sealing cap and fixed to the ampoule.

Seven ampoules were prepared in this way and subjected to growth of the crystal while changing the rotational frequency of the ampoule (Run Nos. 1–7), during which each of the ampoules was horizontally arranged in the three zone horizontal furnace used as a crystal growth furnace and the each zone temperature of the growth furnace was controlled to adjust the temperature of the raw material side to 900° C. and that of the seed crystal side to 850° C.

Under these conditions, the rotational frequency of the ampoule was determined in each of the crystal growth experiments in such a manner that $Gr=2.2\times10^4$, $g=980$ $cm/s^2$, $L=3$ cm, $\Delta\sigma=8.41\times10^{-5}$ $g/cm^3$, $\rho=1.93\times10^{-3}$ $g/cm^3$, $\nu=2.3\times10^{-1}$ $cm^2/s$ and $(fL^2/\nu)$ be in the range of 0 to 78. Since the maximum value of f corresponding to the above described rotational frequency is 2 Hz and smaller than $(1/\pi)(g/2L)^{1/2}=(1/\pi)(980/3)^{1/2}=4.1$, it is clear that $f<(1/\pi)(g/2L)^{1/2}$. In Table 1 are shown the growth conditions and growth results (growth rate and crystallinity).

| Run No. | 1 | 2 | 3 | 4 | 5 | 6 | 7 |
|---|---|---|---|---|---|---|---|
| f (Hz) | 0 | 0.1 | 0.3 | 0.5 | 1 | 1.5 | 2 |
| $fL^2/\nu$ | 0 | 3.9 | 12 | 20 | 39 | 54 | 78 |

-continued

| Run No. | 1 | 2 | 3 | 4 | 5 | 6 | 7 |
|---|---|---|---|---|---|---|---|
| $Gr/(fL^2/\upsilon)$ | — | 5600 | 1800 | 1100 | 560 | 400 | 280 |
| Growth Rate (g/day) | 3.8 | 3.9 | 3.3 | 2.3 | 1.8 | 1.6 | 1.5 |
| Crystal Surface Morphology | rough | rough | rough | smooth | smooth | smooth | smooth |
| Voids in Crystal | more | more | more | less | no | no | no |

In a zone of $Gr/(fL^2/v)<1000$, the growth rate is decreased as compared with the growth in Run No. 1 in which the ampoule is not rotated, which teaches that gas convection is suppressed by rotation of the ampoule. In addition, the crystal grown in this zone has a surface not roughened, namely, smooth surface, and does not contain voids inside. It is apparent from these results that rotation of the ampoule capable of satisfying the relationship of $Gr/(fL^2/v)<1000$ is effective for suppressing convection and for crystal growth.

Advantages of the Invention

According to the present invention, suppressing of occurrence of a natural convection in a fluid in a cylindrical vessel can be carried out in economical manner and maintained for a long time by employing the above described constructions.

In a method for the growth of a compound semiconductor crystal of Group II-VI elements of Periodic Table by a chemical vapor transport method using iodine as a transport agent, occurrence of a gaseous natural convection can effectively be suppressed and a large-sized crystal can thus be grown.

What is claimed is:

1. A method of suppressing buoyancy-driven convection in a gas in a cylindrical vessel on Earth, comprising:

maintaining, in a horizontal position on Earth, the vessel in which the gas is filled when there exists a density gradient in the gas due to a difference in temperature, concentration, or partial pressure;

rotating the vessel about a longitudinal axis thereof;

arranging a solid in the vessel;

fixing the solid to the vessel such that it is rotated with the vessel;

wherein said rotating is set at a rotational frequency f which satisfies the relationship $$(1/\pi)(g/2L)^{1/2}>f>(gL\Delta\rho/\rho)/(1000v),$$

where L is a diameter of the vessel, g is a gravitational acceleration, $\rho$ is a density of the gas, $\Delta\rho$ is a difference between a minimum density and a maximum density of the gas due to a temperature distribution, concentration distribution, or a partial pressure distribution along the longitudinal axis of the vessel, and $\mu$ is a kinematic viscosity coefficient.

2. A method of suppressing buoyancy-driven convection in a gas in a cylindrical vessel on Earth, comprising:

maintaining, in a horizontal position on Earth, the vessel in which the gas is filled when there exists a density gradient in the gas due to a difference in temperature, concentration, or partial pressure;

rotating the vessel about a longitudinal axis thereof;

wherein said arranging the solid in the vessel further comprises maintaining the solid in one zone of the vessel, which one zone is separated by a network partition plate from another zone which is a convection suppressing zone;

wherein said rotating is a set at a rotational frequency f which satisfies the relationship $$(1/\pi)(g/2L)^{1/2}>f>(gL\Delta\rho/\rho)/(1000v),$$

where L is a diameter of the vessel, g is gravitational acceleration, $\rho$ is a density of the gas, $\Delta\rho$ is a difference between a minimum density and a maximum density of the gas due to a temperature distribution, concentration distribution, or partial pressure distribution along the longitudinal axis of the vessel, and v is a kinematic viscosity coefficient.

* * * * *